United States Patent [19]

Suenaga et al.

[11] 3,818,584

[45] June 25, 1974

[54] METHOD FOR MANUFACTURING A SEMICONDUCTOR APPARATUS

[75] Inventors: Masanobu Suenaga, Yokohama; Tetsuo Machii; Takahiro Sawano, both of Tokyo; Takehiko Kobayashi, Kawasaki; Tadao Dengo, Yokohama; Tetsuzo Nakai, Kawaguchi, all of Japan

[73] Assignee: Tokyo Shibaura Electric Co., Ltd., Kawasaki-shi, Japan

[22] Filed: Sept. 5, 1972

[21] Appl. No.: 286,130

Related U.S. Application Data

[62] Division of Ser. No. 59,853, June 25, 1970, Pat. No. 3,715,802.

[30] Foreign Application Priority Data

| | | |
|---|---|---|
| Sept. 6, 1967 | Japan | 42-56768 |
| Sept. 27, 1967 | Japan | 42-61666 |
| Feb. 14, 1968 | Japan | 43-8836 |

[52] U.S. Cl. .................... 29/588, 156/307, 156/293

[51] Int. Cl. .................... B01j 17/00

[58] Field of Search ...... 29/627, 588; 156/307, 308, 156/309, 293

[56] References Cited

UNITED STATES PATENTS

| | | | |
|---|---|---|---|
| 2,955,974 | 10/1960 | Allen | 156/309 |
| 3,256,589 | 6/1966 | Warren | 29/627 |

*Primary Examiner*—W. Tupman
*Attorney, Agent, or Firm*—George B. Oujevolk

[57] ABSTRACT

A method for manufacturing a semiconductor apparatus comprising the steps of: taking two electrode substrate plate members and subjecting at least a part of said plate members, excepting that part which is to contact electrodes of a semiconductor element, to a surface treatment in order to increase the adhesion of adhesive applied thereto; arranging said two plate members substantially in parallel while positioning a plurality of laminated electrically insulating layer members between said plate members so that said layer members will be mounted to each other and to the plate members by adhesive preimpregnated in said insulating layer members, at least one of said plate and layer members having recesses formed therein for receiving semiconductor elements, and, meanwhile juxtapositioning semiconductor elements having at least two electrodes with regard to said recesses so that said semiconductor element electrodes shall contact said non-treated parts of said plate members while being sealed between said plate and layer members in said recesses when said plate and layer members are pressed together, and, pressing while heating said plate and layer members together to form a unitary structure.

8 Claims, 45 Drawing Figures

METHOD FOR MANUFACTURING A SEMICONDUCTOR APPARATUS

CROSS REFERENCE TO RELATED APPLICATION

This is a Divisional application of U.S. Pat. application Ser. No. 59,853, filed June 25, 1970, now U.S. Pat. No. 3,715,802.

The present invention relates to a method for manufacturing a semiconductor apparatus.

With a diode taken as an example, there will now be described the prior art semiconductor apparatus. The commonest glass-sealed diode required a large number of parts and had various drawbacks, for example, high material cost, complicated assembling process and weakness to mechanical shocks. Among diode envelopes of simple construction there was a moulded resin type. However, it still had the shortcomings that due to poor heat resistance it failed to be used in high power rectification, had low reliability, and required a moulding die matching its configuration to be provided in the manufacturing process.

A semiconductor element including not only a diode, but a rectifier and transistor as well has to be tightly sealed in an envelope in order to avoid harmful external effects such as those of moisture, improve mechanical strength and heat release. To date, however, it has been difficult to attain all these objects, and if they were to be forcibly carried out, there would unavoidably result a complicated manufacturing process and a consequential high product cost.

Also where it was intended to construct an A.C. full wave rectifying circuit using, for example, a plurality of semiconductor rectifying elements, there were the drawbacks that it was required to connect by a conductor the external electrode of each semiconductor element sealed in an envelope, manufacture involved a complicated process, and the product was weak to mechanical shocks and cumbersome and heavy due to a large space requirement.

It is accordingly the primary object of the present invention to provide a method for manufacturing a semiconductor apparatus which is very resistant to mechanical impacts and thermal effects and only requiring extremely low production cost and also to offer a method capable of manufacturing such a semiconductor apparatus in large quantities with great economy.

Another object of the invention is to provide a method for manufacturing a composite body of rectifying elements.

Still another object of the invention is to provide a method for manufacturing a compact strong rectifying apparatus for an automobile alternator.

According to the present invention, the aforementioned shortcomings can be eliminated by forming a semiconductor element integrally with an envelope and extremely simplifying or omtting parts, for example, connecting wires. It is also possible to obtain a composite body of semiconductor elements which is of simple, strong construction, because a plurality of semiconductor elements can be sealed in an envelope integrally formed therewith.

To obtain such a semiconductor apparatus, there is used a technique of manufacturing laminated panels. Namely, between the layers of electrically insulating material is sandwiched an adhesive agent, for example, a pre-preg (an abbreviated name for a pre-impregnated material) prepared by impregnating glass cloth or the like with thermosetting resin. One or more semiconductor elements are sealed into the cavity or cavities previously provided in the prepreg with electrical lead-out performed from the electrode thereof. The entire laminate thus prepared is formed into an integrally bonded body under heat and pressure. This process is very simple and permits quantity production. The semiconductor apparatus thus fabricated is of extremely simple construction, very resistant to mechanical shocks, and satisfactorily dissipates heat. It is also of light weight and requires a substantially small space. Therefore it is remarkably adapted for use in a device for which the aforementioned characteristics are strongly demanded, such as an automobile rectifier to convert an A.C. current from its A.C. dynamo to a D.C. current.

These and other objects and effects of the present invention will be apparent from the following description taken by reference to the appended drawings, in which.

Figure 7:
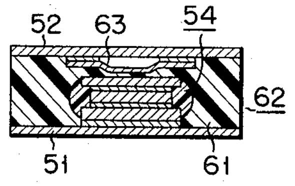
Figure 8:
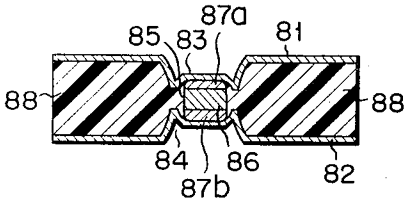
Figure 9:
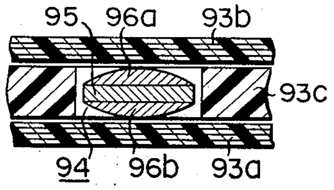
Figure 10:
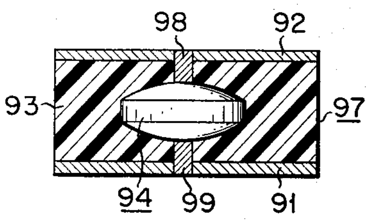
Figure 11:
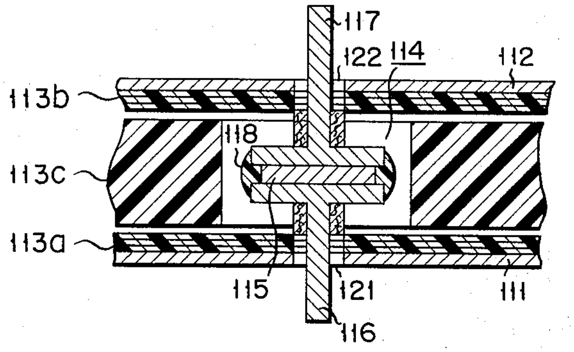
Figure 12:
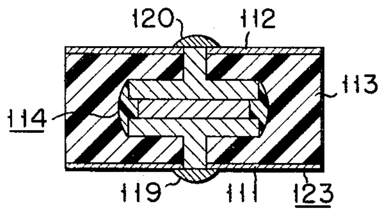
Figure 13:
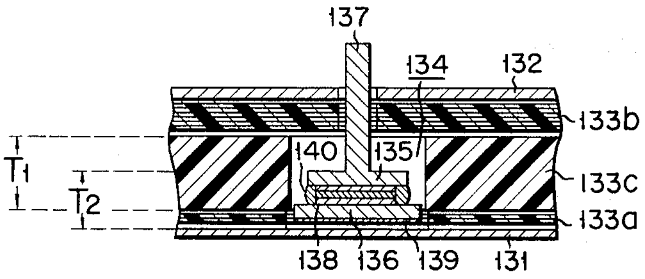
Figure 14:
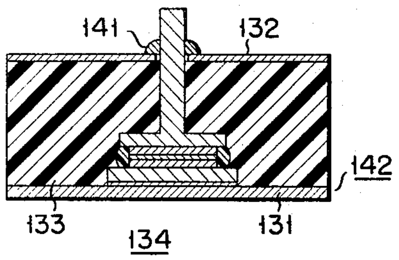
Figure 15:
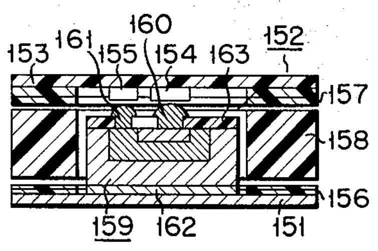
Figure 16:
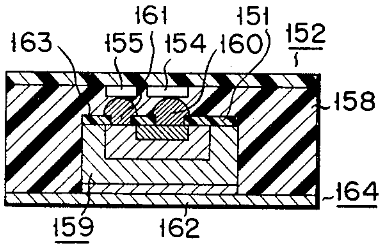
Figure 17:
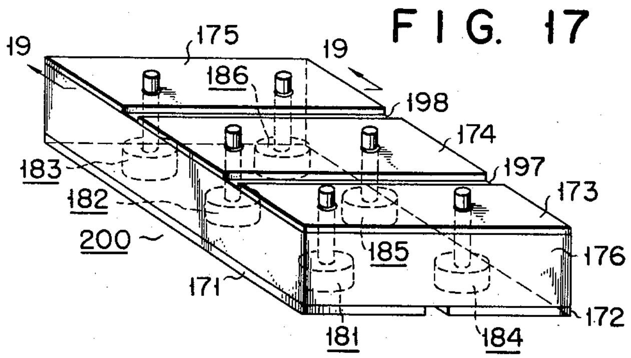
Figure 18:
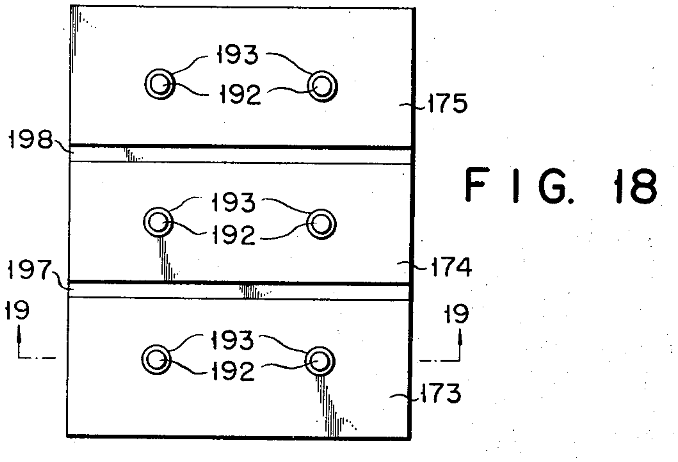
Figure 19:
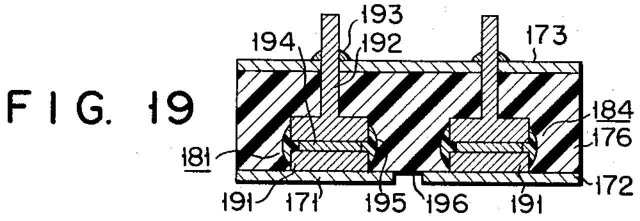
Figure 20:
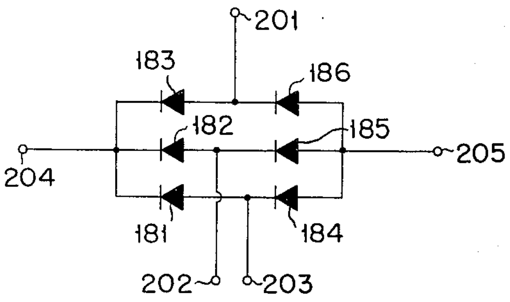
Figure 21:
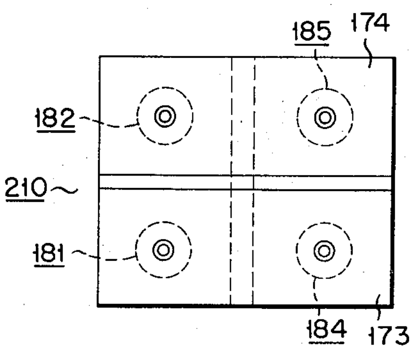
Figure 23:
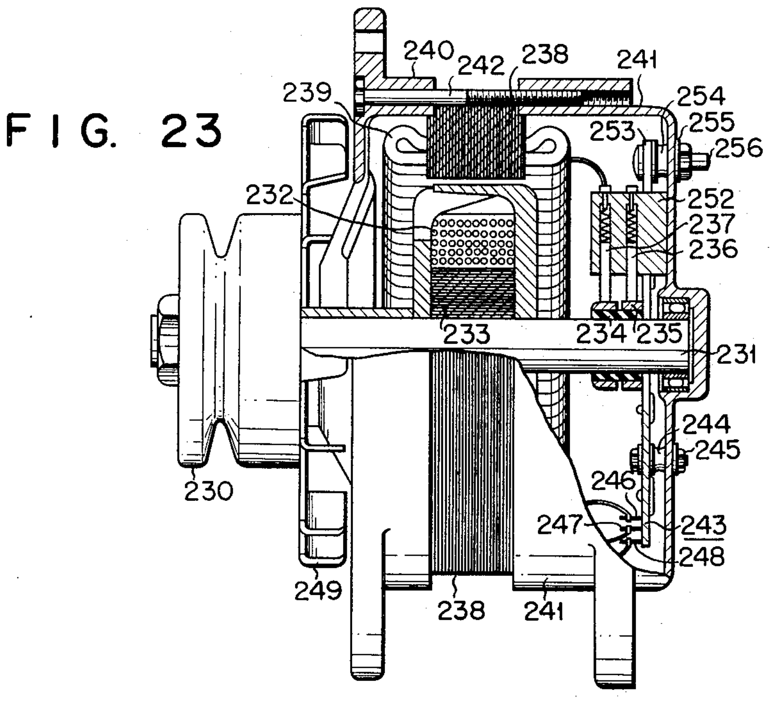
Figure 22:
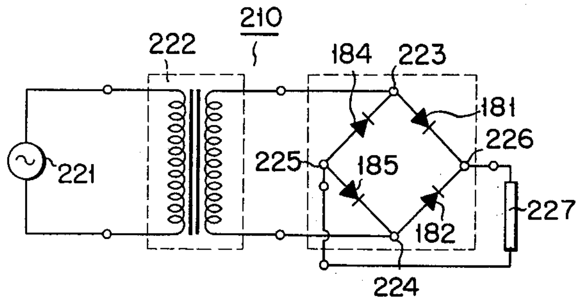
Figure 24:
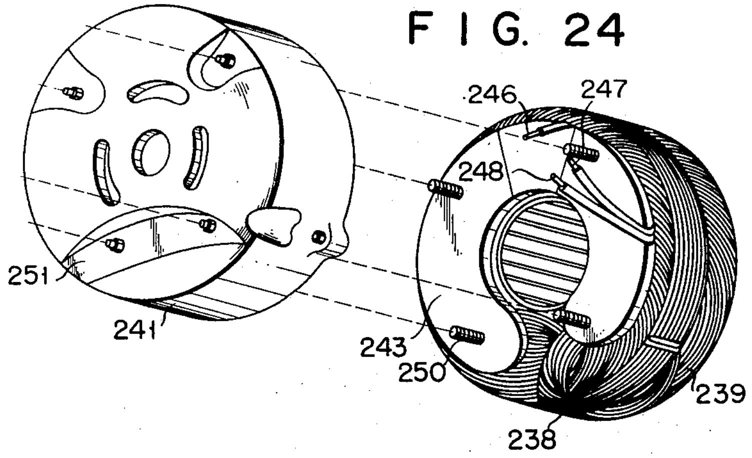
Figure 25:
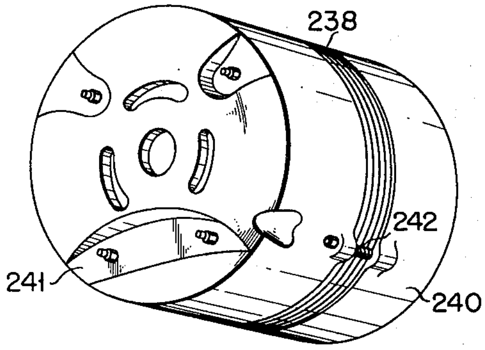
Figures 26, 27:
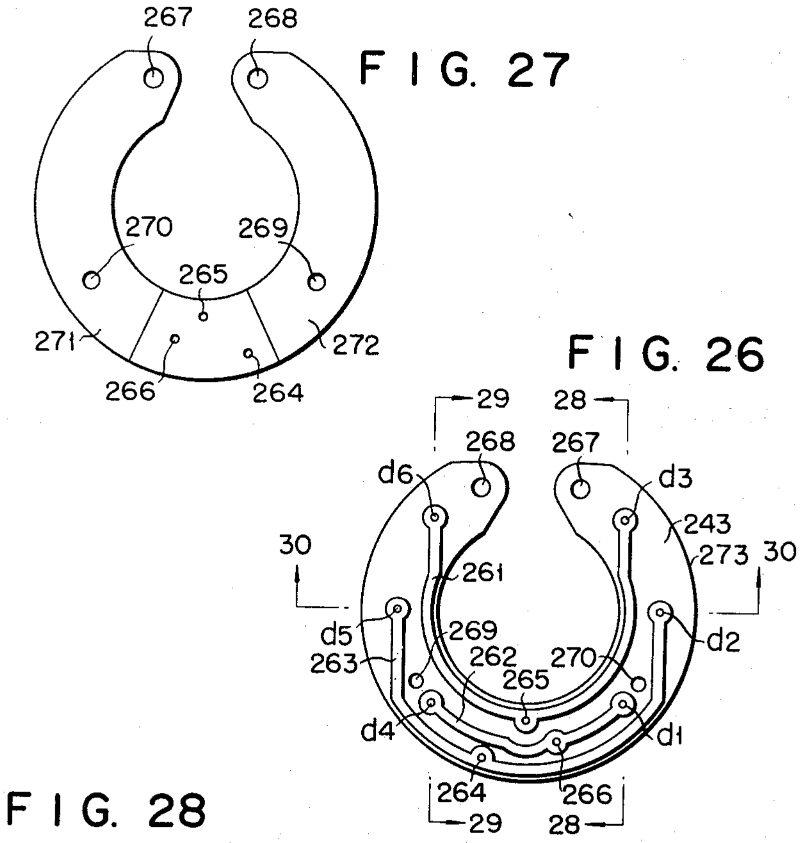
Figure 28:
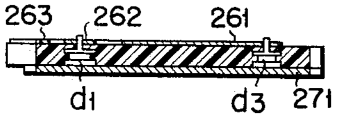
Figure 29:
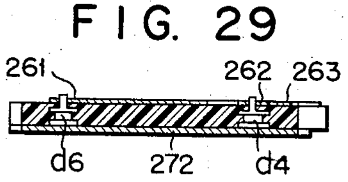
Figure 30:
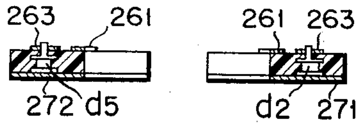
Figure 31:
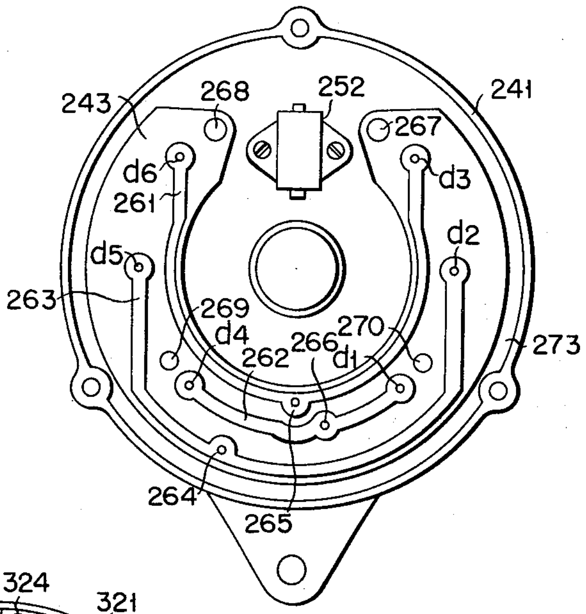
Figures 32A, 32B, 33:
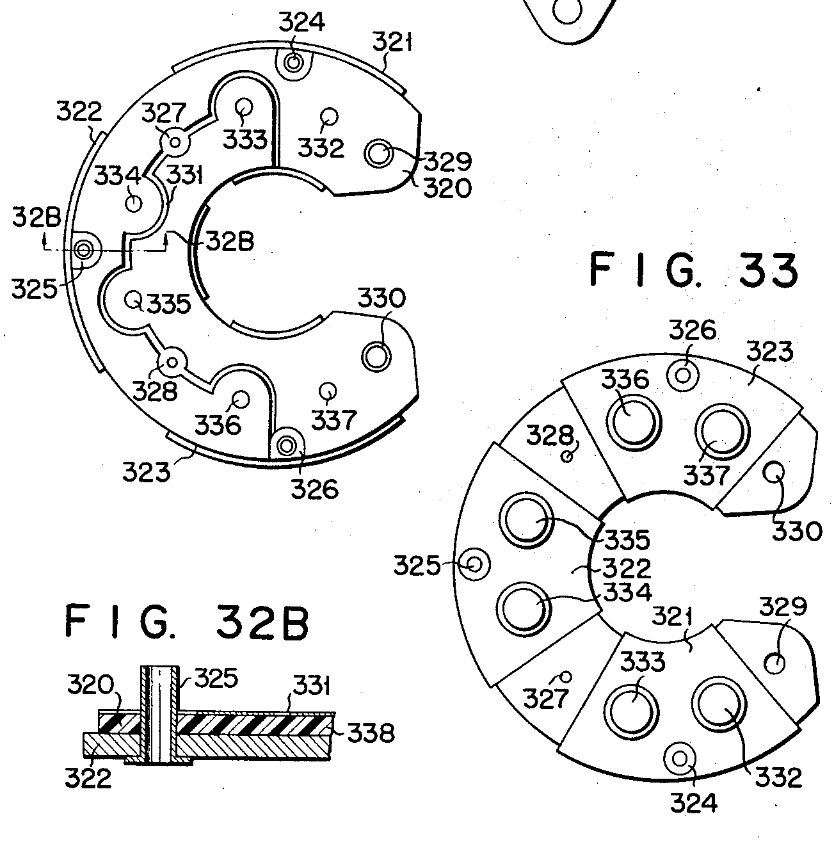
Figure 34:
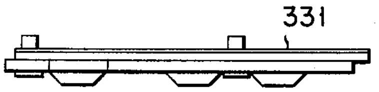
Figures 35, 36:
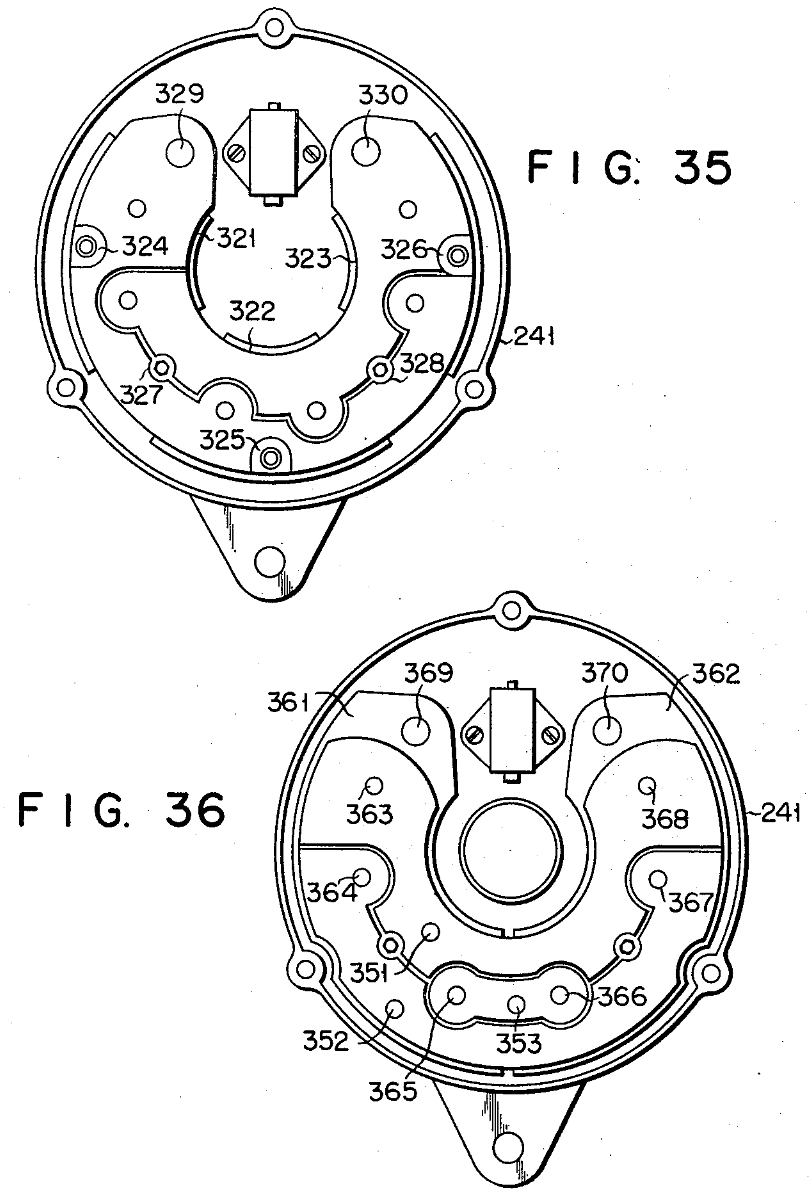
Figure 38:
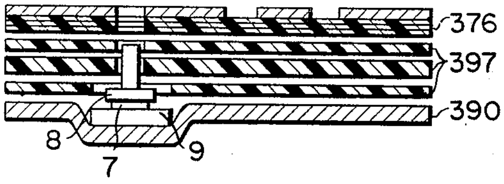
Figure 39:
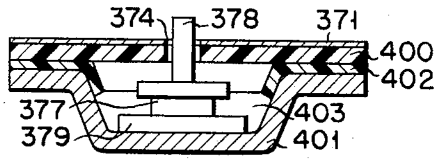

FIGS. 7 and 8 respectively are cross sections of other examples of diodes obtained by the invention;

FIGS. 9 and 11 respectively are cross sections of a part of the processes for manufacturing a semiconductor apparatus according to another embodiment of the invention;

FIGS. 10 and 12 respectively are cross sections of diodes prepared by the process of FIGS. 9 and 11;

FIG. 13 is a cross section of a part of the process for manufacturing a diode according to another embodiment of the invention;

FIG. 14 is a cross section of the diode prepared by the process of FIG. 13;

FIG. 15 is a cross section of a part of the process for manufacturing a transistor according to another embodiment of the invention;

FIG. 16 is a cross section of the transistor prepared by the process of FIG. 15;

FIG. 17 is a perspective view of a semiconductor rectifier apparatus prepared by the invention, showing the interior thereof;

FIG. 18 is a plan view of the semiconductor rectifier apparatus of FIG. 17;

FIG. 19 is a cross section of the semiconductor rectifier taken on line 19—19 of FIG. 17 as viewed in the direction of the arrows;

FIG. 20 is a circuit connection for the rectifier of FIGS. 17 and 18;

FIG. 21 is a plan view of a semiconductor bridge rectifier according to the invention, showing the interior thereof;

FIG. 22 is a circuit for the rectifier of FIG. 21;

FIG. 23 shows, with a part broken away, an automobile alternator fitted with a semiconductor rectifier apparatus according to the invention;

FIG. 24 is a perspective view of the alternator with a part dismembered;

FIG. 25 is a perspective view of the external aspect of a part of the alternator of FIG. 24;

FIG. 26 is a plan view of the semiconductor rectifier apparatus removed from the alternator of FIG. 23;

FIG. 27 is a back view of the rectifier apparatus of FIG. 26;

FIGS. 28, 29 and 30 respectively are cross sections of the rectifier of FIG. 26 taken on lines 28—28, 29—29 and 30—30 respectively as viewed in the direction of the arrows;

FIG. 31 is a plan view of the semiconductor rectifier apparatus of FIGS. 26 and 27 as fitted to the case of the alternator of FIG. 23;

FIG. 32A is a plan view of another example of the semiconductor rectifier apparatus according to the invention used in combination with the automobile alternator;

FIG. 32B is a cross section of the semiconductor rectifier of FIG. 32A on line 32B—32B of FIG. 32A as viewed in the direction of the arrows;

FIGS. 33 and 34 respectively are a back view and a front elevation of the semiconductor apparatus of FIG. 32A;

FIG. 35 is a plan view of the semiconductor rectifier of FIG. 32A as fitted to the alternator case;

FIG. 36 is a plan view of another example of the semiconductor rectifier according to the invention as fitted to the alternator case;

FIGS. 37A to 37F represent the process of manufacturing a semiconductor apparatus according to the invention;

FIG. 38 illustrates a part of the process for preparing another example of the semiconductor apparatus; and FIG. 39 is a cross section of another example of the semiconductor apparatus according to the invention.

There will now be described an embodiment of the present invention by reference to the appended drawings. It will be understood that the same numerals denote the same parts. More particularly, there will be described the diode of the present invention along with manufacturing process thereof by reference to FIGS. 1 to 3.

There are provided for use copper electrode substrates 11 and 12 and prepreg plates 13*a*, 13*b* and 13*c*. The prepreg plates are prepared by impregnating in advance base material such as glass cloth, synthetic fiber cloth, etc. with adhesive thermosetting resins such as epoxy resin, polyester resin, diaryl phthalate resin or phenolic resin. Among them is known, for example, G-10 type of Micaply Company. Generally, this resin product feels dry as touched by the finger at room temperature. When heated at 100° to 200°C between 10 minutes and 100 hours, the impregnated resin sets and develops a bonding force, so that it can be used as an adhesive agent. In this case, it is generally the practice to apply pressure in order to ensure bonding. The laminated plate may be formed by superposing several layers of such prepreg material.

The contact planes between the electrode substrates 11 and 12 and the prepreg material, excluding the contact plane between the electrode substrates 11 and 12 and the electrodes 17*a* and 17*b* of the semiconductor element 15, is subjected to oxidising treatment so as to strengthen bonding between the electrode substrates 11 and 12 and the prepreg material. During the oxidising process, however, there inevitably occurs the simultaneous deposition of an oxide film on the contact plane between the electrode substrates 11 and 12 and the electrodes 17*a* and 17*b* of the semiconductor element 15. Since such deposition is undesirable, it may be etched off with a solution of ferric chloride, ammonium persulfate, chromic acid or sulfuric acid by means of, for example, photo-etching, silk screen or offset printing. It is, of course, permissible selectively to subject only the desired areas to surface treatment. Since the surface treatment of the electrode substrate is only required to be of such type as will assure the strengthening of bonding between the substrate and an adhesive agent prepared from resins or the like, the roughening of the substrate surface, for example, may be effective in addition to the oxidising treatment. And where impact resistance is not particularly demanded, the surface treatment may be omitted.

The semiconductor element 15 used in this embodiment consists of solder electrodes 17*a* and 17*b* formed on both planes of a silicon pellet 16 having, for example, one P-N junction formed therein. The side of the semiconductor element 15 is encapped with silicone rubber 18 to protect the P–N junction.

Between a pair of electrode substrates 11 and 12 there are inserted prepreg materials 13*a* and 13*b* perforated with a large number of holes 14*a*, 14*b* . . . In the holes 14*a*, 14*b* . . . are arranged semiconductor elements 15 in such a manner that the electrodes 17*a* and 17*b* mounted on both sides thereof are brought into contact with the electrode substrates 11 and 12.

Figure 2:
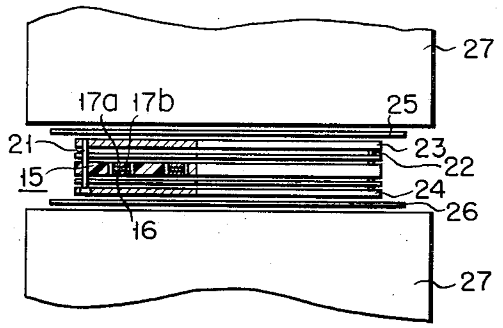
FIG. 2 is a side view of said process with a part broken away.

The prepreg material surrounding the semiconductor diode element 15 is rendered thicker than the silicon pellet 16 so as to prevent pressure from being centered on the diode element 15. As shown in FIG. 2, the semiconductor diode elements 15 are placed in the holes 14*a*, 14*b* . . . and the prepreg materials 13*a*, 13*b* . . . are sandwiched between the electrode substrates 11 and 12 whose oxidised surfaces are disposed inside. Further, the entire laminate is inserted between stainless steel plates 23 and 24 provided with guide pins 21 and 22 to be used in the exact superposition of the individual laminated members. From both outer sides of the stainless plates 23 and 24 are applied heat and pressure to the laminate through cushion paper materials 25 and 26 by means of the presses of heating and pressing devices 27. Thus the electrode substrates and prepreg materials are bonded into an integral laminated body. If, in this case, solder electrodes are alloyed with the electrode substrates during the aforementioned heating and pressing operation, then there will be obtained a better effect in ensuring stronger electrical connection between the semiconductor element and electrode substrates.

Figure 1:
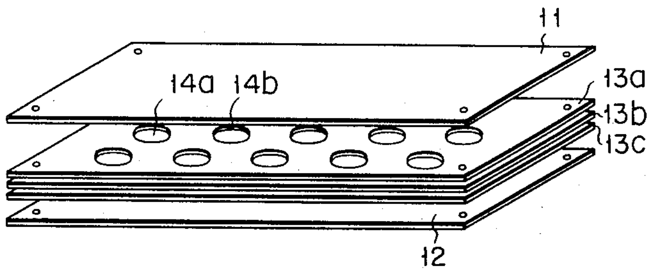
FIG. 1 is a perspective view of a part of the process for manufacturing a semiconductor apparatus according to an embodiment of the present invention.
Figure 3:
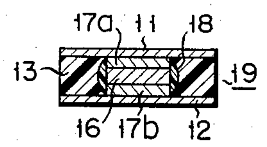
FIG. 3 is a cross section of the semiconductor apparatus prepared by the process of FIGS. 1 and 2.

While the construction of the semiconductor apparatus of the present invention and the manufacturing method thereof have been summarised, there will be further described more concrete examples with numerical data by reference to FIGS. 1 to 3.

A silicon pellet 16 having 600 V peak inverse voltage prepared by diffusing a P-type impurity into an N-type substrate having resistivity of 10 ωcm is finished to a size 2.0 mm in diameter and 0.25 mm thick. Thus there is obtained a semiconductor diode 15 whose electrode consists of solder layers 17*a* and 17*b* about 0.1 mm thick formed on both sides of the silicon pellet 16. Next there are provided for use four sheets of epoxy resin prepreg material 13 each 0.15 mm thick and perforated with a large number of 3.5 mm diameter holes 14*a*, 14*b* . . . arranged at equal intervals, and two copper plates 11 and 12, 35 microns thick prepared by oxidising one side thereof and removing by the known photoetching technique that portion of the oxide film which will later be soldered to the solder electrodes of the semiconductor diode element. After being set in place as described above, the aforementioned components are heated and pressed 10 minutes at a temperature of 190°C and a pressure of 30 $Kg/cm^2$ respectively using a heating and pressing device to form an integrally bonded body. Thus there is obtained a laminated body 0.48 mm thick containing a large number of semiconductor elements.

The semiconductor diode element 15 contained in the semiconductor apparatus is completely surrounded by resin. This is due to the fact that the resin impregnated in the prepreg material is forced out under pressure and close up spaces within the holes. Further, glass cloth or the like which constitutes the core material of the prepreg member is directly retained in place, so that the thickness of the semiconductor apparatus can also be determined by that of the prepreg member.

The semiconductor apparatus manufactured by the present invention is of very simple construction and can be miniaturized. Moreover, the apparatus is sealed at a lower heating temperature than that which was conventionally used in sealing a diode in a glass envelope, so that the semiconductor element produced is not subject to any harmful effect. Further, heat dissipation is carried out very effectively by a copper plate formed broadly over the surface of the element, thus enabling the element to have a high current capacity despite its small size and great resistance to mechanical impacts.

As described above, the manufacturing process is also very simple. There is no need to provide any special moulding die to fabricate semiconductor apparatuses one by one. According to the manufacturing process of the present invention, a large number of semiconductor elements are inserted into a broad laminar body, and these laminar bodies are superposed in a considerable number of piles and simultaneously heated and pressed.

Figure 4:
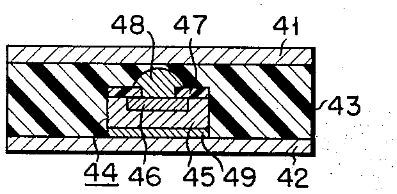
FIG. 4 is a cross section of another semiconductor apparatus of this invention prepared by the same process as that of FIGS. 1 and 2.

The aforementioned basic concept of the present invention admits of various applications, and there will now be described the preferred embodiment thereof by reference to the appended drawings. FIG. 4 presents a finished semiconductor diode 40. Into the N-type silicon substrate 45 is selectively diffused a P-type impurity utilising the specific nature of a silicon dioxide film 47 to form a P-type region 46. In the P-type region 46 and N-type region 45 respectively of the silicon pellet 44 there are formed silver electrodes 48 and 49. These silver electrodes 48 and 49 are very conductive and have a good cushioning action due to their great softness and flexibility, so that they can be used as a cushion member and establish a satisfactory ohmic contact with the electrode substrates 41 and 42 when a required contact pressure is applied therebetween.

Figure 5:
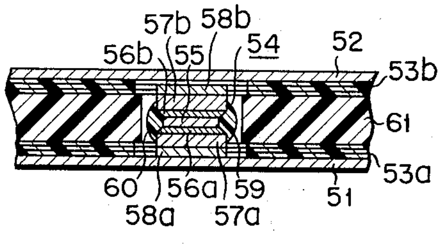
FIG. 5 is a cross section of a part of the process for manufacturing a semiconductor apparatus according to another embodiment of the invention.
Figure 6:
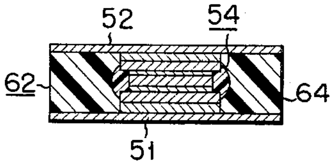
FIG. 6 is a cross section of the diode prepared by the process of FIG. 5.

FIGS. 5 and 6 represent another embodiment of the invention. The semiconductor diode element 54 consists of a silicon pellet 55 having a P–N junction formed therein, copper plates 57*a* and 57*b* brazed to both sides of the silicon pellet 55 using silver-containing high temperature solders 56*a* and 56*b* having a melting point of about 400°C, solder layers 58*a* and 58*b* formed on the surface of the copper plates 57*a* and 57*b*, and an encapsulant 60. On the copper electrode plate 51 is mounted a prepreg material 53*a* perforated with a large number of holes at a prescribed interval. Further on the prepreg material 53*a* is superposed a laminated plate 61 perforated with holes to match those of the prepreg material 53*a*. This laminated plate 61 is desired to be substantially as thick as the semiconductor diode element 54 including the solder layers 58*a* and 58*b*. In the space provided by superposing the prepreg material 53*b* on the laminated plate 61 is placed the semiconductor diode element 54 to contact the electrode substrate 51 with the solder electrode 58*a*. With the copper electrode substrates 52 superposed, heat and pressure are applied to bond the electrode substrates 52 with the laminated body 61 and seal the semiconductor element 54.

In the foregoing embodiment, the laminated plate is already solidified, and receives the greater part of pressure applied, so that it prevents undue pressure from being added to the semiconductor diode element. In the bonding of the laminated plate and copper palte, the prepreg material may be replaced by several other organic adhesive agents such as phenol rubber, butylal phenol denatured epoxy and phenol epoxy polyamide. In this case, the adhesive agent easy to use is a filmy type prepared by coating epoxy resin or phenol resin on a filmy body made of polyamide resin or the like. However, the prepreg material has the advantage of increasing the mechanical strength of the entire semiconductor apparatus due to the incluđion of a fibrous material in the form of fabric.

FIG. 7 represents the case where the semiconductor diode element 54 of FIGS. 5 and 6 includes a flexible cushioning metal plate 63 in order to absorb an unduly high pressure if applied.

FIG. 8 shows the construction where a pair of electrode substrates 81 and 82 themselves are rendered flexible by forming flexible portions 83 and 84. In this case there is used a prepreg adhesive material as an electrically insulating non-metallic sealing envelope 88. Thus where heat and pressure are applied, the semiconductor diode element 85 consisting of a silicon pellet 86 having a P–N junction formed therein and layers 87*a* and 87*b* of brazing material are prevented from being damaged due to excessive pressure. The prepreg material concurrently serves the purposes of insulatingly enveloping the semiconductor diode and integrally bonding the electrode plate therewith.

In FIGS. 9 and 10, the semiconductor diode element 94 consists of a silicon pellet 95 and solder electrodes 96*a* and 96*b* formed on both sides of the pellet 95. On the prepreg material 93*a* is mounted a laminated plate 93*c* perforated with a large number of holes arranged at equal intervals. Semiconductor diode elements 94 are placed in the holes of the laminated plate 93*c* and further thereon is superposed the prepreg material 93*b*. Thereafter heat and pressure are applied as described above to bond the laminated plate 93*c* with the prepreg materials 93*a* and 93*b* and seal the semiconductor diode elements 94. At the part of the prepreg materials 93*a* and 93*b* facing the semiconductor diode element 94 there is perforated by a superhigh speed drill a hole deep enough to extend to the solder layer of the semiconductor diode element 94. Or depending on the circumstances, the surface of the laminated plate 93*c* may be planed off so as to expose the solder layer. Where perforation is carried out, conductor layers 98 and 99 are formed at the bored parts by immersing the laminated body in a molten soldering liquid or by non-electrical plating. In this case, the prepreg material and conductor layer play the role of an electrode substrate. Where plastic material is used as an electrode substrate, non-electrical plating thereon may be carried out, for example, by the following process. The plastic material is first soaked in a solution of tin chloride and then in a solution of palladium chloride. At this time the palladium precipitates on the plastic due to the effect of the tin used in the former process. Plating may be made with said palladium as a nucleus.

In FIGS. 11 and 12, the silicon diode pellet 115 comprises nail lead electrode lead wires 116 and 117. The circumferential parts (indicated by the marks xxx) of lead wires 116 and 117 are subjected to surface treatment, for example, oxidization or abrasion in order to increase bonding between the lead wires and the resin. Between the electrode substrates 111 and 112 perforated wih holes 121 and 122 through which to insert electrode lead wires 116 and 117, and the prepreg materials 113*a* and 113*b* are inserted a laminated plate 113*c* and a semiconductor diode element 114 on whose circumferential surface is coated an encapsulant 118. All these components are integrally bonded by applying heat and pressure as described above. If the semiconductor element is required to have a large current capacity, it will be sufficient conductively to connect the element to the electrode substrates 111 and 112 by providing, for example, solder layers 119 and 120. In addition to the diode, there may be used other materials, for example, DIAC or TRIAC as a semiconductor element.

In FIGS. 13 and 14, there are mounted on a copper electrode substrate 131 a prepreg material 133*a* perforated at prescribed intervals and laminated plate 133*c*. In the void space is placed a semiconductor element 134 prepared by brazing a copper plate 136 to one side of a silicon diode pellet 135 and a nail head electrode lead wire 137 to the other, using silver-containing high temperature solder 138. On the back side of the copper electrode plate 136 is formed a tin solder layer 139 having a melting point of about 230°C. The thickness $T_1$ of the laminated plate 133*c* used in this embodiment is greater than the thickness $T_2$ of the main part of the semiconductor element 134 extending from the electrode plate 136 to the flat top of the electrode 137 so as to prevent pressure from being directly applied to the semiconductor element 134. After enclosing the semiconductor element 134 provided with an encapsulant 140 in the void space, there are superposed a prepreg material 133*b* perforated at prescribed intervals and a copper electrode plate 132. Heat and pressure are applied as in the preceding embodiments so as to seal the semiconductor diode element 134. As shown in FIG. 14, the nail head lead 137 and the upper electrode plate 132 are brazed together by a solder layer 141 to improve thermal conductivity therebetween. Also in this embodiment, it is effective to apply oxidising treatment to the contact plane between the electrode and the prepreg material of the electrode substrate. Further, the previous brazing of the tin soldering layer 139 to the electrode substrate 131 will ensure better connection.

FIG. 15 represents the application of the present invention in a planar type transistor. The semiconductor element 159 comprises three regions defined by double diffusion: emitter region, base region and collector region. The emitter electrode 160 and base electrode 161 are formed of relatively soft metal, for example, silver, with an insulating protective film 163 such as silicon oxide or the like perforated at a part. On the bottom of the collector region is formed a solder layer electrode 162. The lower electrode substrate 151 is a copper plate, while the upper electrode substrate 152 is a printed circuit plate. On an insulating plate 153, for example, of a laminated plate are formed conductive passages 154 and 155 of aluminum, copper or the like. The emitter electrode 160 and base electrode 161 are superposed for contact with the conductive passages 154 and 155 and prepreg materials 156 and 157 lying inbetween. The laminated plate 158 is rendered substantially as thick as the semiconductor element 159 to prevent excess pressure from being applied to the latter. The electrodes 160 and 161 and conductive passages 154 and 155 are securely fitted together by the same operation as described in connection with the embodiment of FIG. 4. The laminated body thus composed is integrally bonded by heat and pressure. The end of each of the conductive passages 154 and 155 extends outside at a prescribed point, for example, at the top or side of the upper electrode plate 152. This embodiment uses a printed circuit plate on one side of the electrode plate. However, it is permissible to use such printed circuit plate on both sides thereof. It is also possible to braze in advance a collector electrode solder layer 162 having a melting point higher than the curing temperature of the prepreg material to the electrode substrate 151 and superpose the prepreg and other components.

The foregoing embodiment relates to a planar type transistor. However, it will be apparent that the present invention is applicable to other semiconductor apparatuses, for example, an integrated circuit. The particular advantage of the present invention that the aforementioned construction eliminates the necessity of providing any interior lead wires is extremely profitable in manufacturing an apparatus involving an integrated circuit.

FIGS. 17 to 19 present a rectifying apparatus for converting a 3-phase A.C. current to a D.C. current using a composite body of six semiconductor apparatuses such as the embodiment of FIGS. 13 and 14. There will now be described the embodiment of FIGS. 17 to 19 by reference to FIG. 20. A.C. inputs supplied to the 3-phase A.C. input terminals 201, 202 and 203 are rectified by diodes 181, 182, 183, 184, 185 and 186 and appear at the output terminals 204 and 205 as a D.C. current.

Diode elements 181, 182 and 183 mounted on a first copper electrode substrate 171 form a first group of the same polarity, to which one of the electrodes 191 is connected. Diode elements 184, 185 and 186 disposed on a second copper electrode substrate 172 constitute a second group of the same polarity, to which the aforementioned electrode 191 is connected so as to provide an opposite polarity to that of the first group. The surroundings of the diode elements 181, 182, 183, 184, 185 and 186 are mutually insulated by an envelope 176. The top of the other electrode 192 of the diode elements 181, 182, 183, 184, 185 and 186 extends to the outside of the electrically insulating envelope 176 to be brazed to a third, fourth and fifth copper electrode substrates 173, 174 and 175.

These electrode substrates form conductive passageways by connection with each diode element of the first and second groups in the following manner. The third electrode substrate 173 connects the first diode element 181 of the first group with the first diode element 184 of the second group to form a third group (181 and 184), the fourth electrode substrate 174 connects the second diode element 182 of the first group with the second diode element 185 of the second group to form a fourth group (182 and 185) and the fifth electrode substrate 175 connects the third diode element 183 of the first group with the third diode element 186 of the second group to form a fifth group (183 and 186).

There will be further described the connection between the diode elements and related electrode substrates. The diode element 181 consists of a silicon diode pellet 194 having an N-region formed on the lower side and a P-region on the upper side, and an electrode plate 191 and a nail head lead electrode 192 fitted to both sides of the silicon diode pellet 194. The electrode plate 191 is connected to the first electrode substrate 171 and the nail head lead electrode 192 to the third electrode substrate 173 by soldering material 193. The silicon diode pellet 194 is protected on the outside with an encapsulant 195. The diode element 184 is constructed in the same way as the diode element 181 excepting that it has an opposite polarity to that of the latter.

As mentioned above, the first and second electrode substrates 171 and 172 and the third, fourth and fifth electrode substrates 173, 174 and 175 are kept insulated from each other, and the circuit of this embodiment is constructed in the same way as shown in FIG. 20. Consequently when a 3-phase A.C. input is supplied to the third, fourth and fifth electrode substrates 173, 174 and 175, a D.C. current will be obviously obtained across the first and second electrode substrates 171 and 172.

The manufacture of the semiconductor rectifier of FIGS. 17, 18 and 19 is carried out in the same way as described in connection with FIG. 13, namely, by arranging a plurality of semiconductor elements with due consideration to their polarity and other factors and bonding them together by heat and pressure. In the electrode substrates are cut grooves 196, 197 and 198 to form conductive passageways 171, 172, 173, 174 and 175. These grooves may be cut in the electrode substrates in which there are already formed prescribed electric circuits prior to their integral bonding by heat and pressure. Said grooves 196, 197 and 198 are substantially filled with resin impregnated in the envelope 176 by heat and pressure process.

In any case, the diode elements are arranged in such a manner that their polarity is reversed one row after another, and the integrally bonded body is cut in portions such that each portion contains a semicondcutor element. This is all that is required in preparing the semiconductor diode of the present invention. Since there is no need to set up a circuit on the outside of the diode by fitting wires and other, production can be effected very easily and in large quantities. Further, where the envelope consists of a prepreg material or laminated plate, the semiconductor rectifier will become very strong due to the presence of a fabric woven from fibrous material, so that in case it is fabricated into a high current capacity type, it will be saved from mechanical embrittlement. Also the use of a broad electrode substrate results in a large contact area with a heat dissipating plate or the like with the consequential great effect of expelling heat. The nail head lead from which a protrusion is removed can be colled on both sides so that it offers a better cooling effect. This provides a particularly prominent advantage in manufacturing a semiconductor diode.

FIG. 22 presents a rectifier apparatus 210 formed from four of the six semiconductor elements involved in the rectifier of FIGS. 17 to 19, showing a bridge circuit as its application along with the equivalent circuit thereof.

Power from an A.C. source 221 is transformed by a transformer 222 and supplied to the A.C. input terminals 223 and 224 of the rectifier apparatus 210. The current is subjected to full wave rectification by diodes 181, 182, 184 and 185, and transferred from D.C. output terminals 225 and 226 to a load 227.

FIG. 23 shows the semiconductor apparatus of the present invention fitted to an automobile 3-phase A.C. dynamo. The rotation of an automobile engine is transmitted to a pulley 230 by the aid of a belt (not shown) so as to rotate an axle 231. To the central part of the rotary axle 231 are fitted a field coil 232 and field core 233. At one end of the rotary axle 231 is mounted a slip ring 235 on an insulation layer 234. To the slip ring 235 are connected brushes 236 and 237. Between the brushes 236 and 237 is connected a D.C. power source to excite the field coil 232. Around the field core 233 are disposed an armature core 238 and armature coil 239. The armature core 238 is securely fitted to cases 240 and 241 which in turn are fixed in place by screw 242. Outside of the case 240 is located a cooling fan 249 and to the interior of the case 241 is fitted a rectifier apparatus 243 by a bolt 245 through an insulation 244. To the A.C. input terminals 246, 247 and 248 of the rectifier apparatus 243 is connected the end of the armature coil 239. The brushes 236 and 237 are mounted on the case 241 by a holder 252. The rectifier apparatus 243 comprises a plurality of diodes and fins 253. One end of the fin 253 is securely fitted to the case 241 by a bolt 256 used as an anode terminal by the aid of an insulation bushing and insulation washer 255.

FIG. 24 is a perspective view of another alternator as dismembered. The rectifier apparatus 243 is mounted on the armature coil 239 by four bolts 250. To the bolts 250 are fitted the case 241 by nuts 251. On the side opposite to that on which is mounted the case 241 of the armature 238, there is fitted, as shown in FIG. 25, the case 240 by a bolt 242 integrally with the aforesaid case 241.

The rectifier apparatus 243 of FIG. 23 has a horse-shoe like configuration for convenience of fitting. First a hores-shoe shaped copper laminated plate 273 having conductive passageways is prepared. On the other hand, as shown in FIGS. 27 to 31, the electrode plate is divided into two right and left portions. Diodes $d_1$, $d_2$, $d_3$, $d_4$, $d_5$ and $d_6$ are fitted in the same arrangement as in the embodiment of FIGS. 17 and 18. On the electrode plates are provided conductive passageways by the same process as in the aforesaid embodiment. A plurality of diodes arranged between the electrode plates are enveloped with an electrically insulating material to complete an integrally formed rectifier apparatus, 3-phase A.C. inputs are supplied to terminals 264, 265 and 266 and D.C. outputs are led out from terminals 267 and 268. Holes 269 and 270 are intended to insert a bolt therethrough so as to fit the rectifier apparatus 243.

FIGS. 32 to 34 represent the case where a rectifier apparatus is prepared by fitting two diodes to each of the three fins provided and forming these three fin members into one integral body. A substrate 320 consists of three fins 321, 322 and 323 and terminal pins 324, 325 and 326 respectively. Holes 327 and 328 are for use in fitting the rectifier apparatus to an alternator (not shown), and holes 329 and 330 are intended for the fitting of D.C. output terminals. As shown in FIG. 32B, the substrate 320 consists of insulating epoxy glass 338 by integrally fitting thereto by a terminal pin 325, a copper foil circuit 331 formed by the known etching technique and an iron fin 322. In this case, the contact area between the terminal pin 325 and fin 322 is brazed with silver alloy, so as to cause them to be tightly attached to each other electrically as well as mechanically. Numerals 332 to 337 denote diodes. The rectifier apparatus thus formed is bolted, as shown in FIG. 35, to the inside of an alternator case 241 through holes 327 and 328.

FIG. 36 shows two fins 361 and 362, to which are fitted one group of three diodes 363, 364 and 365 and another group of three diodes 366, 367 and 368 respectively in opposite arrangement. D.C. output terminals 369 and 370 are provided on the fins 361 and 362 respectively. Numerals 351, 352 and 353 represent A.C. input terminals.

Figure 37A:
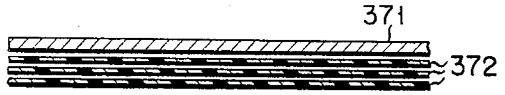
Figure 37B:
Figure 37C:
Figure 37D:

The aforementioned diodes are integrally formed in a substrate 320 as shown in FIG. 32B. There will now be described the manufacturing process thereof by reference to FIGS. 37A to 37F. As illustrated in FIG. 37A, there is superposed on a copper plate 371 about 170 microns thick a prepreg material 372 (an abbreviated form of preimpregnated material prepared by impregnating glass fiber of the like with thermosetting resins such as epoxy resin). The superposed body is formed by heat and pressure into a clad lined laminated plate 373 shown in FIG. 37B. Where a prepreg material is prepared from glass fiber and epoxy resin, it will be sufficient to carry out heating and pressing operation about 2 hours at a temperature of 170°C and a pressure of 20 Kg/cm$^2$. Then as shown in FIG. 37C, the laminated body is cut into a prescribed shape and perforated with a hole 374 for electrical connection of the electrode of the semiconductor element and copper plate. This step can be easily carried out, for example, by press punching. Next as shown in FIG. 37D, there are formed grooves 375 on the copper plate 371 thereby to separate it into several divisions.

Prior to the formation of the grooves 375, the part of the copper plate which requires no etching is protected with the known photoresist material or the like. The copper clad laminated plate is immersed in an etching solution consisting of, for example, ferric chloride. Since the part of the laminated plate covered with said photoresist material and the prepreg material are not affected by etching, there are formed the separating grooves 375. Thus is prepared one of the electrode substrates 376.

Figure 37E:
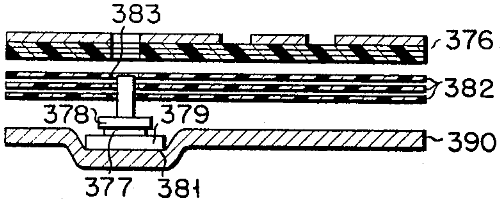
Figure 37F:
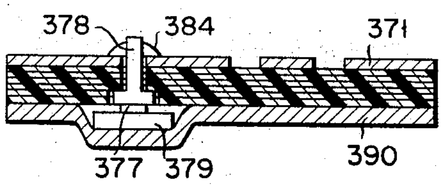

On the other hand, as shown in FIG. 37E, there are mounted electrodes 378 and 379 on both sides of a semiconductor diode element 377 having a P–N junction formed in a single crystal. On both sides of the semiconductor diode element 377 which are to be fitted with the electrodes 378 and 379 are provided in advance silver-containing high temperature solder. When the semiconductor diode element 377 with the electrodes 378 and 379 formed thereon is heated to a temperature of about 350°C to 360°C in a furnace filled with hydrogen gas, the element and electrodes are fused together by the aforesaid solder. The part of the electrode substrate 390 to which the electrode 379 is to be fitted is embossed. To this embossed portion is fused the electrode 379 fitted with the semiconductor diode element 377 using tin solder by heating to a temperature of about 232°C. According to the drawings, one of the electrodes 378 and 379 is plane and the other has a protruding surface. This is simply for the convenience of leading out the electrodes in this embodiment. Therefore it will be understood that the electrodes of the semiconductor apparatus of the present invention are not limited to such types. Thus the electrode 378 is brazed to the electrode substrate 390. On this electrode substrate 390 there may be formed in advance the same conductive passageways for connection of circuits as those of the electrode substrate 376. The electrode substrate 390 having the semiconductor diode element mounted on a prescribed part thereof and the electrode substrate 376 are superposed as shown in FIG. 37E with three sheets of prepreg material 382 lying inbetween. In this case the laminated prepreg material 382 is perforated with a hole 383 to lead out on 378 of the diode electrodes therethrough, and the diode is enveloped with an electrically insulating material. Thereafter as in the preparation of the copper clad laminated plate, heat and pressure are applied 15 to 120 minutes at a temperature of 170°C and a pressure of 5 to 20 Kg/cm$^2$ respectively, using a hot press and pressing jig, thereby to seal the diode between the two electrode substrates. Connection between the diode electrode 379 and copper plate may be made by solder 384 or the like. The solder used in this case preferably consists of the 63 percent tin solder (melting point 183°C). FIG. 37F presents the semiconductor diode element processed up to this point. The diode apparatus thus prepared is finally coated with epoxy resin by spray or dipping.

FIG. 38 presents the manufacturing process wherein there is used a laminated plate 376 as an intermediate electrical insulating material during the step of FIG. 37E and it is bonded by a filmy adhesive agent 397. The filmy adhesive agent includes, for example, nylon film coated with denatured epoxy resin and phenol resin. This type of adhesive material also develops a strong bonding force under pressure at a temperature of about 150°C.

In the foregoing embodiments, it has been described that the semiconductor diode element and the two electrodes fitted thereto are enveloped with the resin forced out of the prepreg material when it is prepared under pressure. However, it is not always necessary for the envelope completely to cover up the semiconductor diode element and the two electrodes. For instance, as shown in FIG. 39, there is inserted only a single sheet of prepreg material 402 between the laminated palte 400 and fin 401. Upon application of heat and pressure, the resin impregnated in the prepreg material 402 is forced out into the embossed part 403. Although, in this case, it does not fully close up the embossed part 403, there occurs no practical inconvenience.

What we claim is:

1. A method for manufacturing a semiconductor apparatus comprising the steps of: taking two electrode substrate plate members and subjecting at least a part of said plate members, excepting that part which is to contact electrodes of a semiconductor element, to a surface treatment in order to increase the adhesion of adhesive applied thereto; arranging said two plate members substantially in parallel while positioning a plurality of laminated electrically insulating layer members between said plate members so that said layer members will be mounted to each other and to the plate members by adhesive preimpregnated in said laminated insulating layer members, at least one of said plate and layer members having recesses formed therein for receiving semiconductor elements, and, meanwhile juxtapositioning semiconductor elements having at least two electrodes with regard to said recesses so that said semiconductor element electrodes shall contact said non-treated parts of said plate members while being sealed between said plate and layer members in said recesses when said plate and layer members are pressed together, and, pressing while heating said plate and layer members together to form a unitary structure.

2. A method as claimed in claim 1, wherein said layer member defines an envelope having a lower fin section for holding the semiconductor element at a prescribed position.

3. A method as claimed in claim 1, wherein said plate member has conductive passages not subjected to said surface treatment, so formed as to selectively contact the electrodes of the semiconductor elements.

4. A method as claimed in claim 1, including the step of first heat pressing one of said plate members on said layer member.

5. A method as claimed in claim 1, wherein one of the two palte members is provided with a recess, said semiconductor element being deposited on the inner bottom surface of the recess so as to electrically connect said bottom surface to one of the electrodes of said semiconductor element.

6. A method claimed in claim 1, wherein one of said plate members includes first, second and third mutually insulated conductive plates in substantially the same plane, placing first, second and third groups of diode elements respectively in the first, second and third conductive plates, each group of diode elements comprising two diodes to which there are electrically connected electrodes of opposite polarities, said second plate member including two mutually insulated conductive units, one of the units connecting the electrodes of one polarity associated with the first, second and third groups of diode elements, the other of said units connecting the electrodes of the opposite polarity associated with said first, second and third groups of diode elements.

7. A method as claimed in claim 1, wherein the semiconductor elements are disposed so as to be surrounded with a horse-shoe shaped electrically insulating intermediate envelope formed thicker than the main portion of said semiconductor elements which are disposed between the horse-shoe shaped plate members and the intermediate envelope, and bonding the two plate members together by the organic adhesive layer to seal the semiconductor element.

8. A method as claimed in claim 1, wherein one of the electrodes of said semiconductor element is electrically connected to a conductive plate included in one of the plate members by means of a cushion member.

* * * * *